(12) United States Patent  
Sugita

(10) Patent No.: US 10,845,708 B2  
(45) Date of Patent: Nov. 24, 2020

(54) EXPOSURE APPARATUS AND METHOD OF MANUFACTURING ARTICLE

(71) Applicant: CANON KABUSHIKI KAISHA, Tokyo (JP)

(72) Inventor: Hikaru Sugita, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/515,467

(22) Filed: Jul. 18, 2019

(65) Prior Publication Data

US 2020/0026197 A1   Jan. 23, 2020

(30) Foreign Application Priority Data

Jul. 23, 2018   (JP) .................................. 2018-138014

(51) Int. Cl.
*G03B 27/42*      (2006.01)
*G03F 7/20*       (2006.01)

(52) U.S. Cl.
CPC .................. *G03F 7/7015* (2013.01)

(58) Field of Classification Search
CPC .. G03F 7/70891; G03F 7/70308; G03F 7/706; G03F 7/70591; G03F 7/70691; G03F 7/7085; G03F 7/70875; G03F 7/70991
See application file for complete search history.

(56) References Cited

U.S. PATENT DOCUMENTS

| 4,641,033 A * | 2/1987 | Petelin .................. H01J 65/044 |
| | | 250/492.1 |
| 2008/0246933 A1* | 10/2008 | Uchikawa ........... G03F 7/70883 |
| | | 355/52 |
| 2013/0141707 A1 | 6/2013 | Baer |

FOREIGN PATENT DOCUMENTS

| EP | 1376185 A2 | 1/2004 |
| JP | 2007317847 A | 12/2007 |
| JP | 2011048126 A | 3/2011 |

OTHER PUBLICATIONS

Extended European Search Report issued in European Appln. No. 19185935.4 dated Dec. 16, 2019.

* cited by examiner

*Primary Examiner* — Mesfin T Asfaw
(74) *Attorney, Agent, or Firm* — Rossi, Kimms & McDowell LLP

(57) ABSTRACT

The present invention provides an exposure apparatus for exposing a substrate, including: an optical system including a barrel and an optical element arranged in the barrel; and an adjustment unit including a heat radiator and configured to adjust imaging characteristics of the optical system by applying heat to the optical element from the heat radiator, wherein the heat radiator is a member including a first end portion and a second end portion on a side opposite to the first end portion and having a variation in physical properties falling within a predetermined range, a central portion between the first end portion and the second end portion of the heat radiator is arranged inside the barrel, and the first end portion and the second end portion of the heat radiator are arranged outside the barrel.

22 Claims, 6 Drawing Sheets

EXPOSURE APPARATUS AND METHOD OF MANUFACTURING ARTICLE

BACKGROUND OF THE INVENTION

Field of the Invention

The present invention relates to an exposure apparatus and a method of manufacturing an article.

Description of the Related Art

There is available an exposure apparatus for projecting a mask pattern on a substrate by a projection optical system to expose the substrate as one type of the apparatuses used in the manufacturing process (lithography process) for a display element such as a liquid crystal panel and a semiconductor device. The imaging characteristics of the projection optical system vary depending on a change in temperature by exposure light and a change in ambient atmospheric pressure. Japanese Patent Laid-Open No. 2007-317847 discloses a method of adjusting (correcting) the imaging characteristics of the projection optical system by arranging a heat radiator near an optical element in the projection optical system and applying heat to the optical element by the heat radiator.

As described in Japanese Patent Laid-Open No. 2007-317847, damage (for example, a disconnection) tends to occur at a joint portion in the hear radiator arranged by joining a plurality of members. When the joint portion is arranged inside the projection optical system, the maintenance of the heat radiator become cumbersome such that the projection optical system must be disassembled at the time of repair of the joint portion.

SUMMARY OF THE INVENTION

The present invention provides a technique advantageous in maintenance of, for example, a heat radiator for adjusting imaging characteristics.

According to one aspect of the present invention, there is provided an exposure apparatus for exposing a substrate, including: an optical system including a barrel and an optical element arranged in the barrel; and an adjustment unit including a heat radiator configured to radiate heat, the adjustment unit being configured to adjust imaging characteristics of the optical system by applying heat to the optical element from the heat radiator, wherein the heat radiator is a member including a first end portion and a second end portion on a side opposite to the first end portion and having a variation in physical properties between the first end portion and the second end portion falling within a predetermined range, a central portion between the first end portion and the second end portion of the heat radiator is arranged inside the barrel so as to be spaced apart from the optical element, and the first end portion and the second end portion of the heat radiator are arranged outside the barrel.

Further features of the present invention will become apparent from the following description of exemplary embodiments with reference to the attached drawings.

DESCRIPTION OF THE EMBODIMENTS

Figure 1:
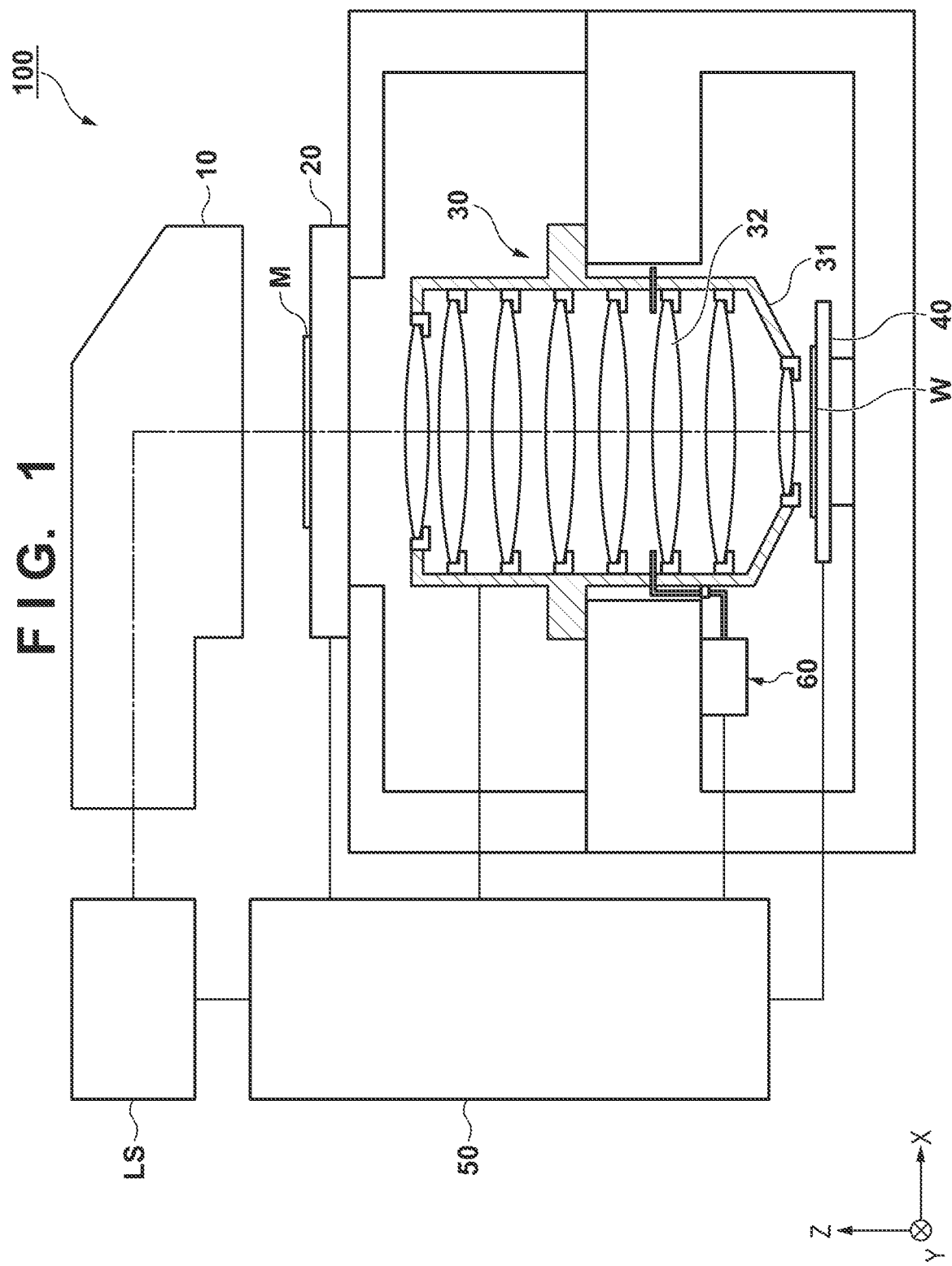
FIG. 1 is a schematic view showing an exposure apparatus.

Exemplary embodiments of the present invention will be described below with reference to the accompanying drawings. Note that the same reference numerals denote the same members throughout the drawings, and a repetitive description thereof will not be given.

First Embodiment

The first embodiment according to the present invention will be described below. FIG. 1 is a schematic view showing an exposure apparatus 100 according to this embodiment. The exposure apparatus 100 can include an illumination optical system 10, an original stage 20 movable while holding an original M (a mask), a projection optical system 30, a substrate stage 40 movable while holding a substrate W (a wafer), and a control unit 50. The control unit 50 controls (controls the exposure processing of the substrate W) the respective components of the exposure apparatus 100. In the following description, a direction parallel to an optical axis (an optical axis of light passing through the projection optical system 30, which is also referred to as an optical axis of the optical elements 32) of the projection optical system 30 is defined as a Z direction, and two directions perpendicular to the plane perpendicular to the optical axis of the projection optical system 30 are defined as X and Y directions.

Using light from a light source LS, the illumination optical system 10 illuminates the original M held by the original stage 20. The original stage 20 is arranged to be movable in, for example, the X and Y directions while holding the original M on which a pattern is formed. The projection optical system 30 projects the pattern image from the original M and transfers the pattern image on the substrate W held by the substrate stage 40. The projection optical system 30 includes a barrel 31 (housing) and a plurality of optical elements 32 (for example, lenses) arranged inside the barrel 31. Each of the plurality of optical elements 32 is supported by the barrel 31. The substrate stage 40 is arranged to be movable in, for example, the six axis directions of X, Y, Z, ωX, ωY, and ωZ while holding the substrate W.

In general, in the exposure apparatus 100, the imaging characteristics (for example, aberrations) of the projection optical system 30 vary due to a change in temperature by exposure light and a change in ambient atmospheric pressure. For this reason, an adjustment mechanism 60 (adjustment unit) for adjusting (correcting) the imaging characteristics of the projection optical system 30 is arranged in the exposure apparatus 100 of this embodiment. The adjustment mechanism 60 includes a heat radiator 61 arranged apart from the optical elements 32 and controls the radiation amount from the heat radiator 61 to control the input heat to the optical elements 32, thereby controlling the temperature of the optical elements 32. By controlling (changing) the temperature of the optical elements 32, the shape (surface shape) of each optical element 32 and its refractive index are changed. This makes it possible to adjust the projection optical system imaging characteristics such as coma aberration and astigmatism. The heat radiator 61 includes a first end portion 61a and a second end portion 61b on the side opposite to the first end portion 61a. The heat radiator 61 is a member for generating heat upon energization between the first end portion 61a and the second end portion 61b.

However, if the heat radiator 61 is arranged by bonding a plurality of members, damage (for example, a disconnection) tends to occur at each bonding portion. If the bonding portion is arranged inside the projection optical system 30, maintenance of the heat radiator 61 becomes cumbersome such that the projection optical system 30 must be disassembled at the time of repair of the heat radiator 61 (the bonding portion). In the adjustment mechanism 60 of this embodiment, a single member having uniform physical properties without including the bonding portion is arranged as the heat radiator 61 between the first end portion 61a and the second end portion 61b. Since a central portion 61c between the first end portion 61a and the second end portion 61b in the heat radiator 61 applies heat to each optical element 32, the central portion 61c is arranged inside the barrel 31 of the projection optical system 30 so as to be spaced apart from the corresponding optical element 32. The first end portion 61a and the second end portion 61b of the heat radiator 61 are arranged outside the barrel 31 of the projection optical system 30.

The physical properties of the heat radiator 61 include at least one of, for example, a density, a resistivity, and a heat conductivity, and preferably all of them. The "uniform physical properties" indicate not only perfectly identical physical properties, but also almost identical physical properties. For example, the heat radiator 61 of this embodiment is arranged such that a variation in physical properties between the first end portion 61a and the second end portion 61b falls within the range of 3%, and more preferably 1%. The heat radiator 61 of this embodiment is made of the same material between the first end portion 61a and the second end portion 61b, and more specifically a material having a uniform composition ratio. The term "joining" is defined to include the meanings of "connection", "bonding", and "coupling".

Figure 2:
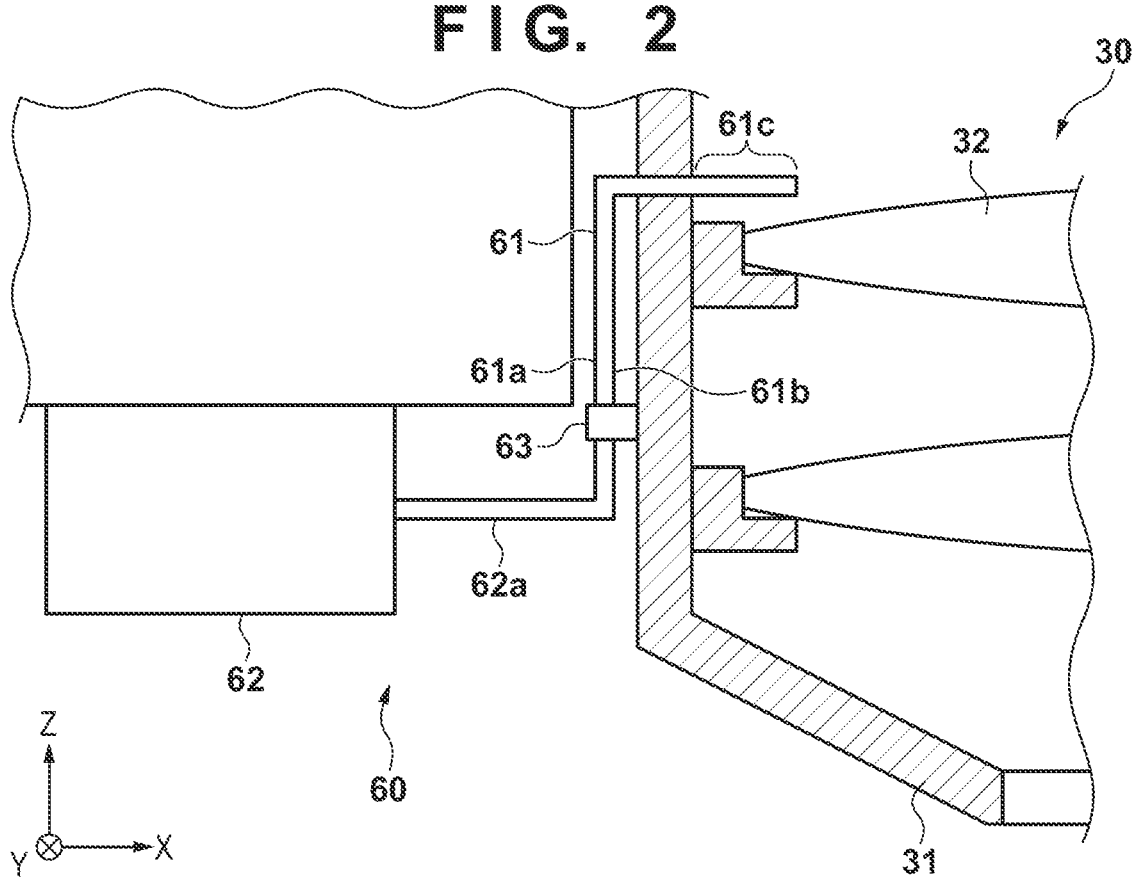
FIG. 2 is a view showing the arrangement of an adjustment mechanism according to the first embodiment.

FIG. 2 is a view showing the arrangement of the adjustment mechanism 60 according to this embodiment. In this case, for example, the adjustment mechanism 60 can be arranged in one of the plurality of optical elements 32 of the projection optical system 30 which is suitable for adjusting the imaging characteristics (for example, aberrations such as coma aberration and astigmatism) to be adjusted. In the example shown in FIG. 1, although the adjustment mechanism 60 is arranged for one optical element 32, but the adjustment mechanism may be arranged for each of the plurality of optical elements 32.

The adjustment mechanism 60 includes, for example, the heat radiator 61, an imaging control unit 62, and a connector 63. The heat radiator 61 is a member for radiating heat upon energization and applying heat to the optical elements 32. The detailed arrangement of the heat radiator 61 will be described in detail later.

The imaging control unit 62 includes, for example, a current driver and a regulator and controls energization to the heat radiator 61 so that the imaging characteristics of the projection optical system 30 are corrected (so as to obtain target characteristics) by applying heat to the optical elements 32. The imaging control unit 62 is arranged outside the barrel 31 of the projection optical system 30 and may be arranged integrally with the control unit 50. In addition, the imaging control unit 62 may include an electronic component (for example, a fuse) for preventing an overcurrent in a circuit for energizing the heat radiator 61. For example, when adjusting the imaging characteristics of the projection optical system 30, a large current such as an impulse waveform may be temporarily applied to the heat radiator 61 in order to reduce a time constant. By arranging a fuse or the like in the imaging control unit 62, a fault mode in which a large current continuously flows to the heat radiator 61 to disconnect the heat radiator 61 can be reduced.

Figure 3:
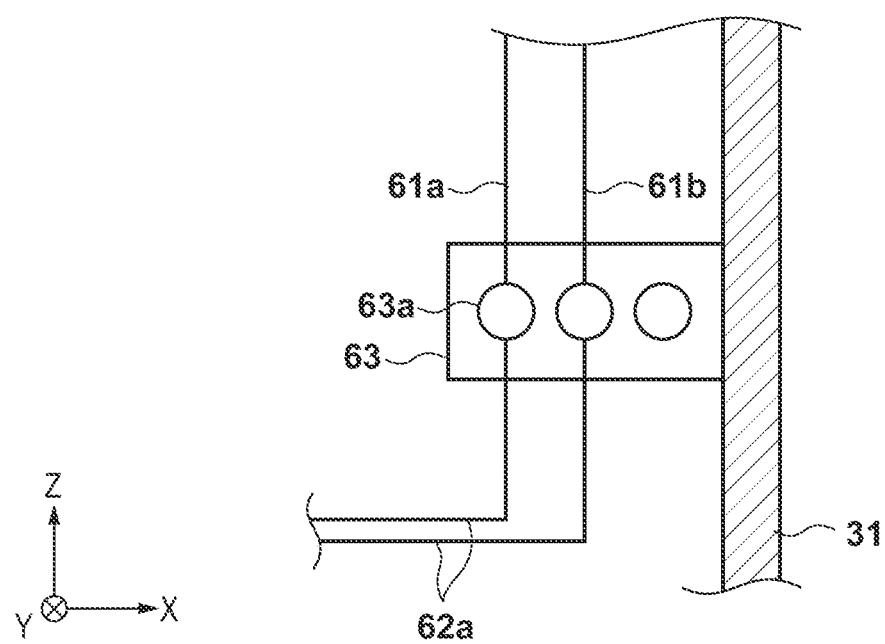
FIG. 3 is a view showing an example of the arrangement of a connector.

The connector 63 includes, for example, a terminal block and a connector to electrically connect the end portions (the first end portion 61a and the second end portion 61b) of the heat radiator 61 to the imaging control unit 62 (more specifically, conductive lines 62a extracted from the imaging control unit 62). FIG. 3 is a view showing an example of the arrangement of the connector 63. The connector 63 can attach or detach the terminal portions of the heat radiator 61 to or from the imaging control unit 62 at the time of assembly, repair, or maintenance of the apparatus. For this reason, the connector 63 preferably includes connection terminals 63a such as the terminal block or connector to detachably connect the terminal ends of the heat radiator 61 to the imaging control unit 62 (the conductive lines 62a). In addition, since the connection terminal 63a may be damaged due to an operation error or the connection terminal 63a is subjected to aging degradation, the plurality of connection terminals 63a are preferably arranged so as to include, for example, supplementary connection terminals in the connector 63, as shown in FIG. 3.

The detailed arrangement of the heat radiator 61 will now be described below. As described above, the heat radiator 61 is made of the single member having uniform physical properties without including any bonding portion between the first end portion 61a and the second end portion 61b. The single member is a member which does not include a joint portion such as a connector joint, a solder joint, and an adhesive joint in the power supply path between the first end portion 61a and the second end portion 61b. The heat radiator 61 can be made of a plate member or conductor of, for example, a metal or ceramic material. Even a plate member or conductor with a coating belongs to the single material if no joint portion is present in the power supply path.

The heat radiator 61 as the single member is preferably arranged to satisfy at least one of the following three arrangement conditions.

[Condition 1] Letting Hmax be the maximum thickness (maximum diameter) and Hmin be the minimum thickness (minimum diameter) in the path (in the entire heat radiator 61) between the first end portion 61a and the second end portion 61b, condition Hmax/Hmin≤2 holds.

[Condition 2] The tensile strength of the heat radiator 61, that is, the strength when pulling the first end portion 61a and the second end portion 61b is 100 MPa or more (more preferably, 150 MPa or more).

[Condition 3] The melting point of the entire heat radiator 61 is 200° C. or more (more preferably 250° C. or more).

As shown in FIG. 2, since the central portion 61c between the first end portion 61a and the second end portion 61b of the heat radiator 61 applies heat to the given optical element 32, the central portion 61c is arranged inside the barrel 31 of the projection optical system 30 so as to be spaced apart from the given optical element 32 near the given optical element 32. On the other hand, the first end portion 61a and the second end portion 61b of the heat radiator 61 are arranged (extracted) outside the barrel 31 of the projection optical system 30 and electrically connected to the imaging control unit 62 (conductive lines 62a) via the connector 63 arranged outside the barrel 31. In this case, the inside of the barrel 31 of the projection optical system 30 is an internal space of the barrel 31 in which the optical elements 32 are arranged. That is, the inside of the barrel 31 is, for example, the range in which a region cannot be accessed manually or by a tool without a process such as extraction of the projection optical system 30 from the exposure apparatus 100 by a crane, disassembly, and the like. In addition, the outside of the barrel 31 of the projection optical system 30 is an external space of the barrel 31 and indicates the range in which a region can be easily accessed manually or by a tool when repairing the apparatus.

In addition, the heat radiator 61 may be arranged to be covered with a coating of, for example, a resin or the like. For example, if the heat radiator 61 is not covered with a coating, the inside of the projection optical system 30 is irradiated with scattered light, and the heat radiator 61 reacts with oxygen and water in the environmental atmosphere, thereby increasing aging degradation (for example, generation of rust). In this case, although the fault mode in which the heat radiator 61 is disconnected due to aging degradation may occur, such a fault mode can be reduced by forming the coating.

In addition, the heat radiator 61 may be arranged in a plate-like shape. For example, if a linear heat radiator 61 is used, it is preferable to bend the linear heat radiator at a large number of positions in order to increase the input heat to the optical elements 32. However, with this arrangement, a component for maintaining the bent state of the heat radiator 61 is required, and a stress concentrates on the bent position. This makes it possible to increase damage at these positions. Accordingly, by arranging the heat radiator 61 in the plate-like shape, the area (input heat area) facing the optical elements 32 can be increased, thereby increasing the input heat amount to the optical elements 32. As compared with a case in which the linear heat radiator 61 is used, damage can be reduced at a high possibility. The heat radiator 61 can be arranged linearly. In this case, a method of minimizing stress concentration on the heat radiator 61 as much as possible can be employed as a method of maintaining the bent state of the heat radiator 61. More specifically, a heat radiator is preferably sandwiched between two plate members or a heat radiator is covered with a frame to maintain the bent state instead of maintaining the bent state using a screw or band.

As described above, the heat radiator 61 used in the adjustment mechanism 60 of this embodiment is made of a member having uniform physical properties between the first end portion 61a and the second end portion 61b. The central portion 61c of the heat radiator 61 is arranged inside the barrel 31 of the projection optical system 30, and the first end portion 61a and the second end portion 61b are arranged outside the barrel 31 of the projection optical system 30. When the heat radiator 61 is arranged and laid out in this manner, damage to the heat radiator 61 can be reduced at a high possibility. At the same time, for example, maintenance such as confirmation of the connecting state between the heat radiator 61 (the first end portion 61a and the second end portion 61b) and the imaging control unit 62 can be facilitated. In this case, according to this embodiment, since radiation heat method (radiant heat method) is employed as a heat transfer method from the heat radiator 61 to the optical elements 32, the heat radiator 61 is arranged to be spaced apart from the optical elements 32. The present invention, however, is not limited to this. For example, if a heat conduction method is employed, the heat radiator 61 may be arranged to contact the corresponding optical element 32.

Second Embodiment

The second embodiment according to the present invention will be described below. This embodiment basically takes over the arrangement of the first embodiment. An adjustment mechanism 60 according to this embodiment includes a first holding member 64a (a first member) and a second holding member 64b (a second member) supported by a barrel 31 of a projection optical system 30. A central portion 61c of a heat radiator 61 which is arranged inside the barrel 31 of the projection optical system 30 is held by being sandwiched between the first holding member 64a and the second holding member 64b. In this case, in this embodiment, like a flexible cable, a plate-like (foil-like) member made of a thin and wide conductor and having a low rigidity in the thickness direction can be used as the heat radiator 61.

Figure 4:
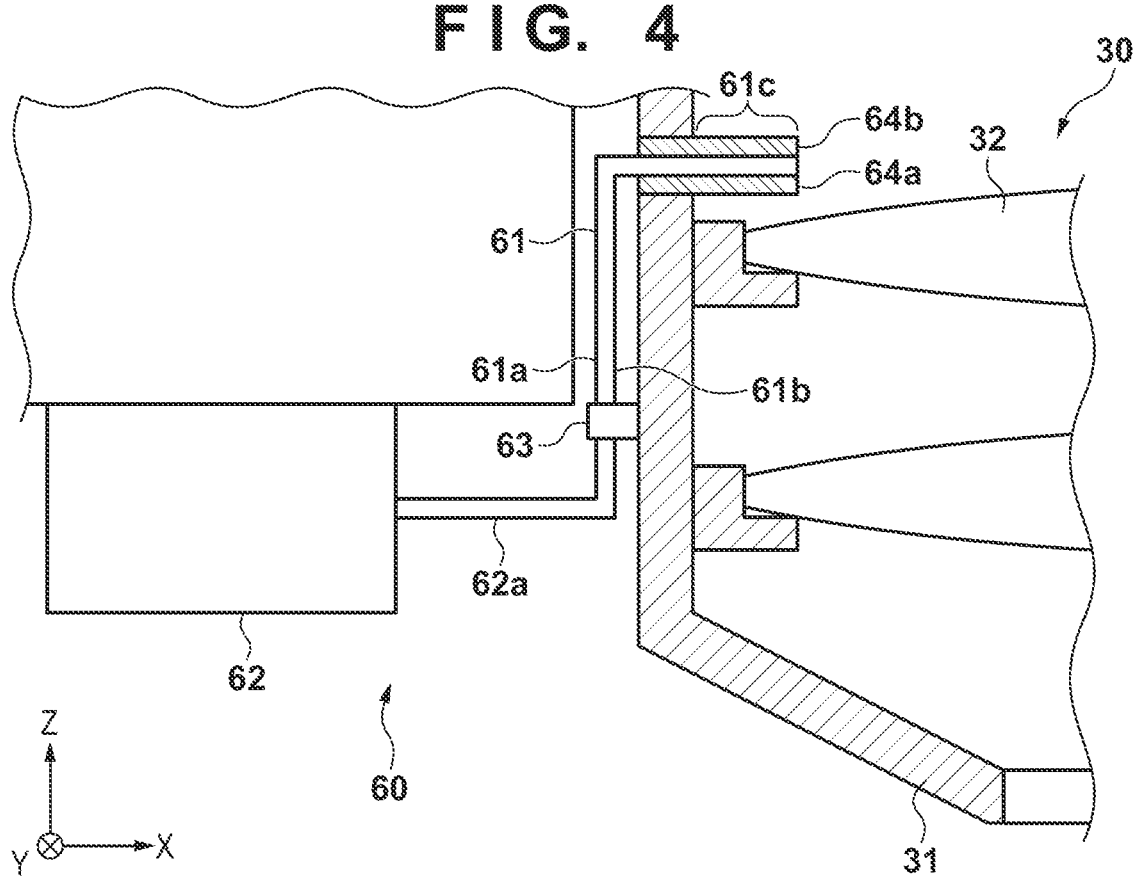
FIG. 4 is a view showing the arrangement of an adjustment mechanism according to the second embodiment.

FIG. 4 is a view showing the arrangement of the adjustment mechanism 60 according to this embodiment. In the adjustment mechanism 60 of this embodiment, as shown in FIG. 4, the central portion 61c of the heat radiator 61 is sandwiched and held between the first holding member 64a and the second holding member 64b supported by the barrel 31. Each of the first holding member 64a and the second holding member 64b is, for example, a plate member, and the first holding member 64a can be arranged on the optical element side with respect to the second holding member 64b. The heat conductivity of the first holding member 64a is preferably higher than that of the second holding member 64b. Accordingly, a ratio of heat emitted from the heat radiator 61 and transferred to the optical elements 32 (heat transfer efficiency to the optical elements 32) can be improved, thereby increasing the adjustable amount of the imaging characteristics of the projection optical system 30. The heat conductivity difference between the first holding member 64a and the second holding member 64b is preferably larger. For example, the first holding member 64a can be made of aluminum, iron, silicon carbide (SiC), aluminum nitride (AlN), or the like, and the second holding member 64b can be made of stainless steel, alumina ($Al_2O_3$), or the like.

Figure 5:
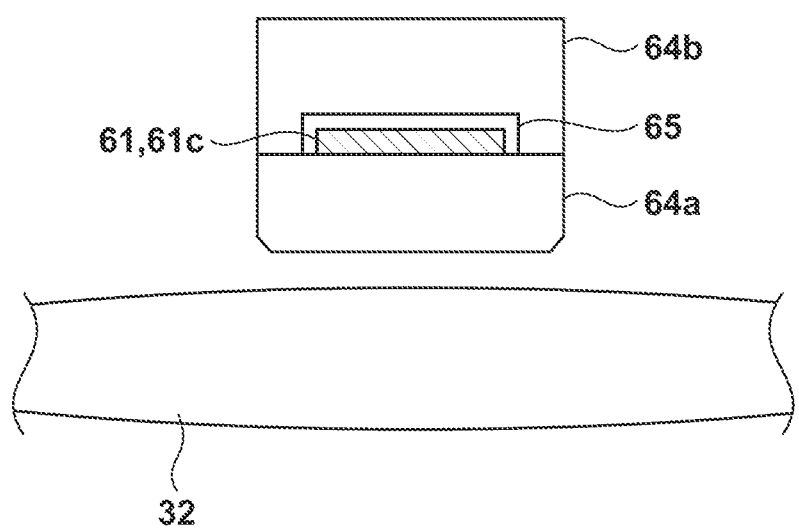
FIG. 5 is a view showing an example of the arrangement for holding a heat radiator by a first holding member and a second holding member.

In addition, FIG. 5 is a view showing an arrangement example (Y-Z sectional plane) for holding the heat radiator 61 by the first holding member 64a and the second holding member 64b. For example, as shown in FIG. 5, a groove 65 is formed in at least one of the first holding member 64a and the second holding member 64b. The heat radiator 61 may be arranged in a space (gap) formed by the groove 65 when the first holding member 64a and the second holding member 64b overlap each other. The groove 65 can be formed at a depth equal to or larger than the thickness of the heat radiator 61. With this arrangement, the stress generated by the heat radiator 61 held by the first holding member 64a and the second holding member 64b can be reduced, and damage to the heat radiator 61 can be reduced at a high possibility.

Figure 6:
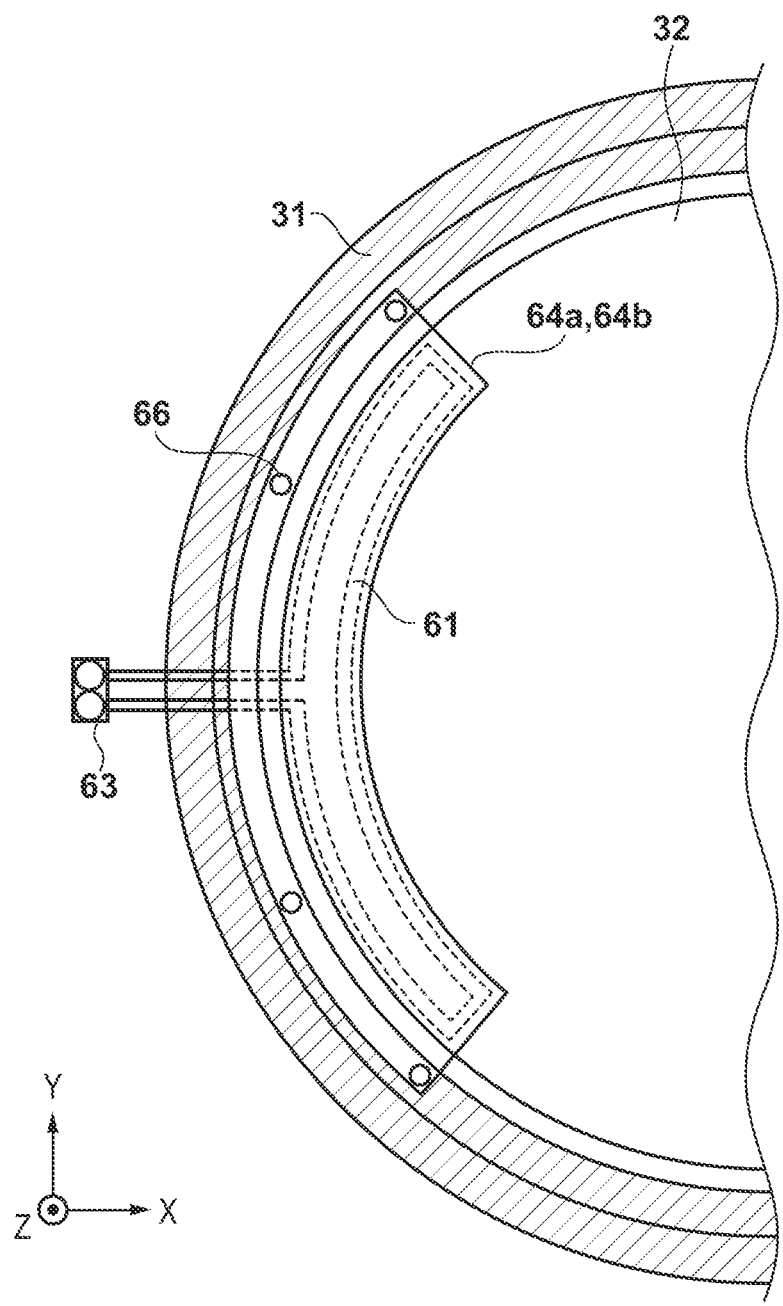
FIG. 6 is a view of the adjustment mechanism according to the second embodiment when viewed from the above.

FIG. 6 is a view of the heat radiator 61 in the adjustment mechanism 60 of this embodiment when viewed from the above (the +Z direction). In the example shown in FIG. 6, inside the barrel 31 of the projection optical system 30, the central portion 61c of the heat radiator 61 is sandwiched and held between the first holding member 64a and the second holding member 64b supported by the barrel 31. In addition, a first end portion 61a and a second end portion 61b of the heat radiator 61 are extracted outside the barrel 31 and connected to an imaging control unit 62 via a connector 63. The first holding member 64a and the second holding member 64b are fixed to the barrel 31 by fixing members 66 such as screws. In addition, the heat radiator 61 (the central portion 61c) can be arranged to have a shape (arcuated shape) along the edge portion of the corresponding optical element 32 in a plane perpendicular to the optical axis of the projection optical system 30 in order to apply heat to the edge portion of the corresponding optical element 32 to correct the imaging characteristics (especially, coma aberration and astigmatism) of the projection optical system 30. In this embodiment, although the heat radiator 61 (the central portion 61c) is formed in an arcuated shape in order to correct coma aberration and astigmatism, the shape of the heat radiator 61 may be arbitrarily changed in accordance with the imaging characteristics to be corrected. In this case, the heat radiator 61 is not arranged in the optical path in the projection optical system 30.

In this case, the adjustment mechanism 60 preferably has a wider range in which the imaging characteristics of the projection optical system 30 can be adjusted. If the adjustable range in the adjustment mechanism 60 is widened, the radiation amount of the heat radiator 61 is increased, and the area (input heat area) facing the optical elements 32 is increased in order to increase the change amount of the temperature distribution of the optical elements 32. In order to increase the radiation amount, it is preferable to increase a current to be supplied to the heat radiator 61 or increase the resistance value of the heat radiator 61. An increase in resistance value of the heat radiator 61 is preferably made by increasing the length of the heat radiator 61 (the central portion 61c) or reducing the sectional area. As the shape of a heat radiator having a small sectional area and a large input heat area, for example, a plate- or foil-like shape having a small thickness and a large width is applicable. More specifically, like a flexible cable, a member for which the cross-sectional width of the heat radiator 61 and the shape of the central portion 61c arranged inside the barrel 31 can be arbitrarily changed can be used as the heat radiator 61. In this case, in order to increase the radiation amount, the width of the heat radiator 61 is narrowed at only a portion facing the corresponding optical element 32 or the length of a portion of the heat radiator 61 is increased by bending this portion. This makes it possible to increase the resistance value. That is, when the flexible cable is used, the shape can be arbitrarily changed so as to increase the resistance value near the corresponding optical element 32.

As described above, in the adjustment mechanism 60 of this embodiment, the first holding member 64a and the second holding member 64b for sandwiching and holding the heat radiator 61 (the central portion 61c) are arranged. The heat conductivity of the first holding member 64a on the optical element side is set higher than that of the second holding member 64b. This makes it possible to hold the heat radiator 61 so as to improve the heat conductivity of heat from the heat radiator 61 to the optical elements 32.

Third Embodiment

The third embodiment according to the present invention will be described below. This embodiment basically takes over the arrangement of the first embodiment. An adjustment mechanism 60 of this embodiment includes a plurality of heat radiators 61 for applying heat to an optical element 32 and is arranged to correct various types of aberrations.

Figure 7:
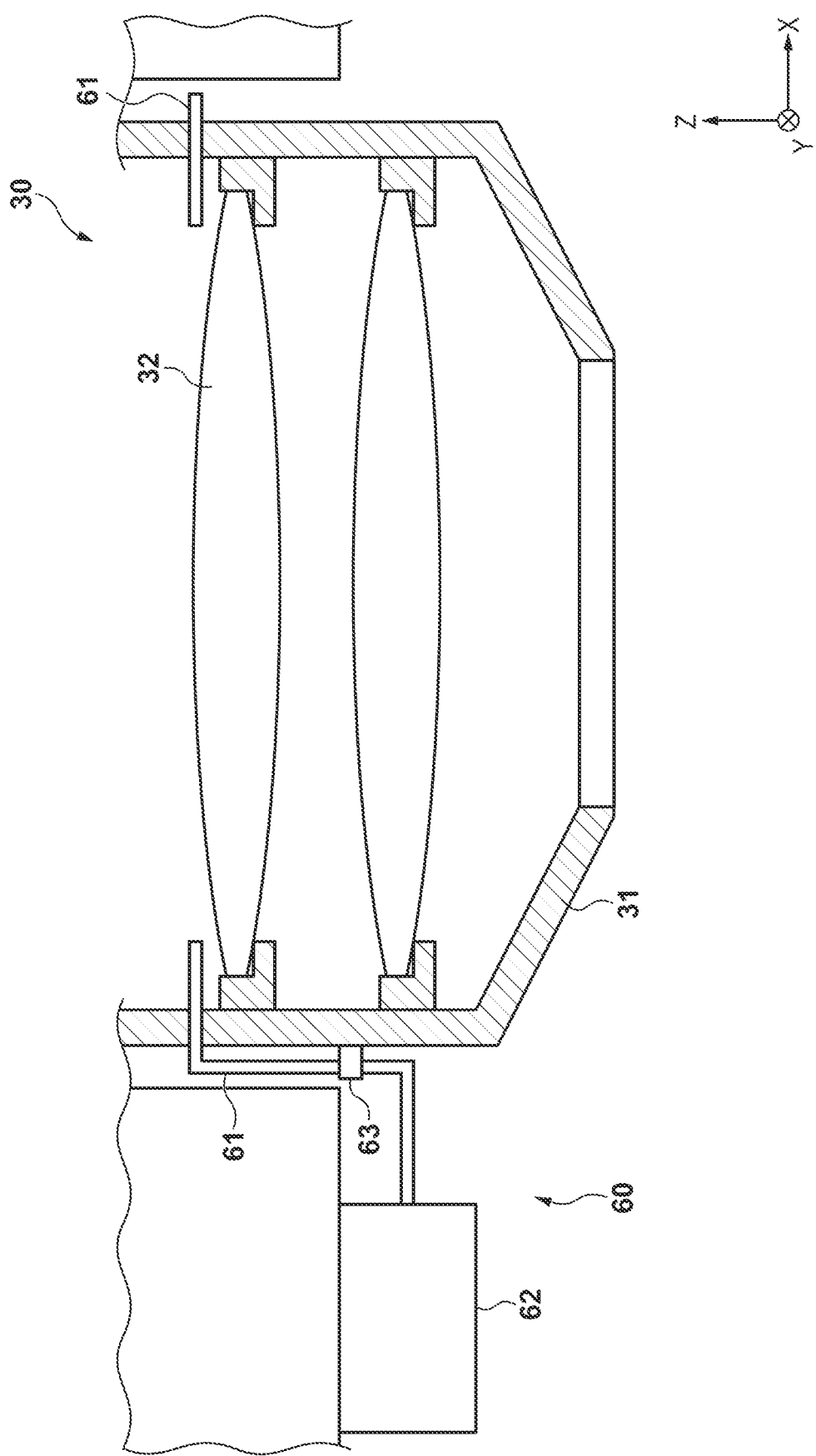
FIG. 7 is a view showing the arrangement of an adjustment mechanism according to the third embodiment.
Figure 8:
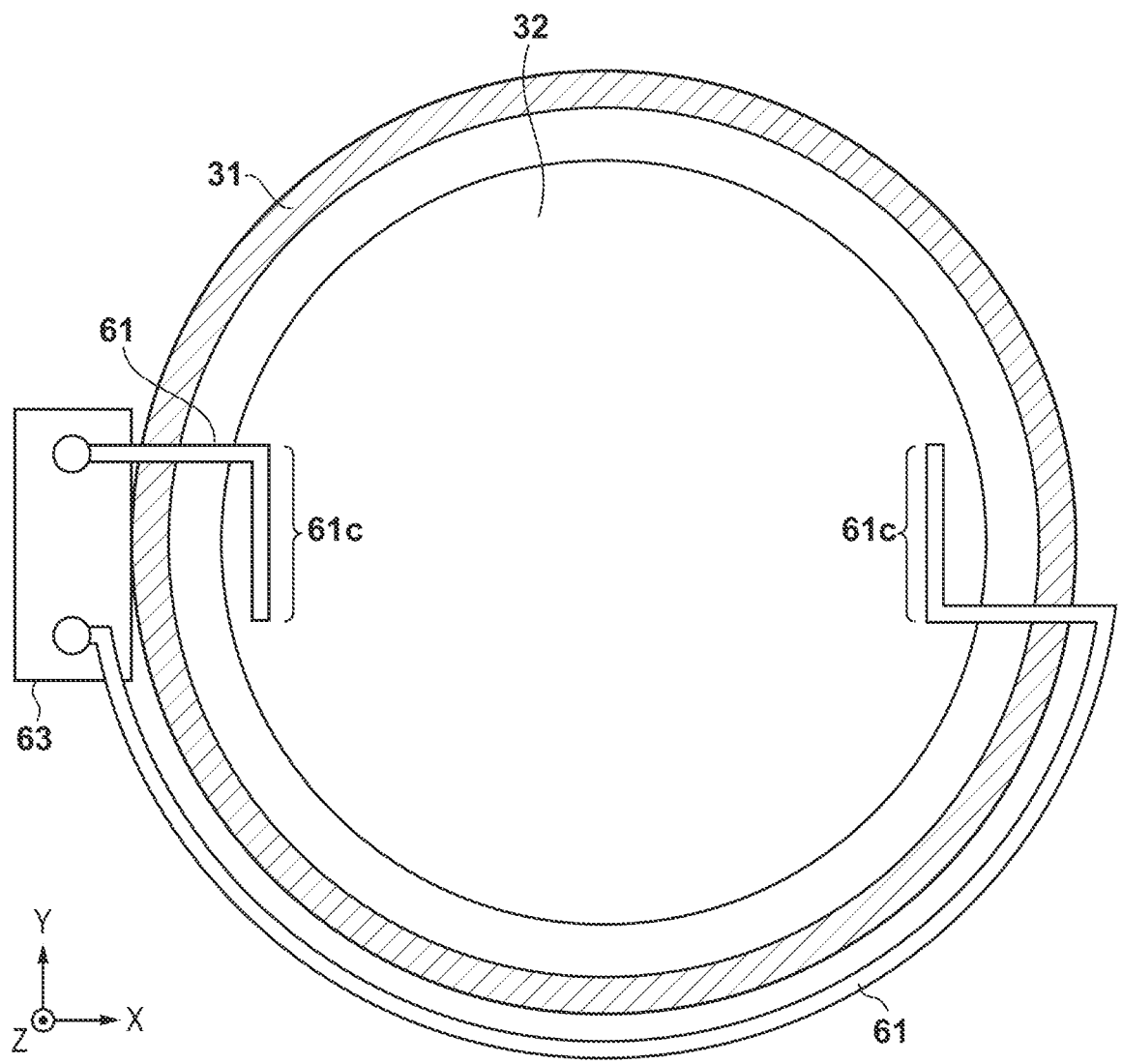
FIG. 8 is a view of the adjustment mechanism according to the third embodiment when viewed from the above.

FIG. 7 is a view showing the arrangement of the adjustment mechanism 60 according to this embodiment. FIG. 8 is a view of the adjustment mechanism 60 (the heat radiators 61 and a connector 63) when viewed from the above. In the arrangement example of the adjustment mechanism 60 shown in FIGS. 7 and 8, the plurality of heat radiators 61 arranged to be spaced apart from the corresponding optical element 32 near the corresponding optical element 32 are arranged so as to apply heat to the edge portions of the corresponding optical element 32. The plurality of heat radiators 61 can be arranged at positions rotationally symmetrical with respect to the optical axis of a projection optical system 30. In the arrangement of the plurality of heat radiators 61, if heat is applied to the corresponding optical element 32 by using only one of the heat radiators 61, the temperature of one side of the corresponding optical element increases, thereby adjusting coma aberration. When heat is applied to the corresponding optical element 32 using the two heat radiators 61, the temperatures on the two sides of the corresponding optical element 32 increase, thereby adjusting astigmatism. That is, various types of aberrations can be corrected using the plurality of heat radiators 61.

A plurality of connectors 63 may be arranged so as to correspond to the plurality of heat radiators 61. However, it may be difficult to arrange the plurality of connectors 63 depending on the outer space of the barrel 31 of the projection optical system 30. In this case, for example, as shown in FIG. 8, one heat radiator 61 is extracted outside the barrel 31 to make it possible to connect the plurality of heat radiators 61 to the imaging control unit 62 via one connector 63. In addition, according to this embodiment, the two heat radiators 61 are arranged in the adjustment mechanism 60. However, three or more heat radiators 61 may be arranged in the adjustment mechanism 60. In addition, the positions where the plurality of heat radiators 61 are arranged may not be rotation-symmetrical with respect to the optical axis of the projection optical system 30.

Embodiment of Method of Manufacturing Article

A method of manufacturing an article according to an embodiment of the present invention is suitable for manufacturing an article, for example, a microdevice such as a semiconductor device or an element having a microstructure. The method of manufacturing the article according to this embodiment includes a step of forming, using the above-described exposure apparatus, a latent image pattern on a photosensitive agent applied to a substrate (a step of exposing the substrate), and a step of developing (processing) the substrate with the latent image pattern formed in the above step. This manufacturing method further includes other known steps (oxidation, deposition, vapor deposition, doping, planarization, etching, resist separation, dicing, bonding, packaging, and the like). The method of manufacturing the article according to this embodiment is advantageous in at least one of the performance, quality, productivity, and production cost of the article, as compared with a conventional method.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-138014 filed on Jul. 23, 2018, which is hereby incorporated by reference herein in its entirety.

What is claimed is:

1. An exposure apparatus for exposing a substrate, comprising:
    an optical system including a barrel and an optical element arranged in the barrel; and
    an adjustment unit including a heating element configured to generate heat, the adjustment unit being configured to adjust imaging characteristics of the optical system by conducting heat generated in the heating element to the optical element,
    wherein the heating element is a single member, formed of a heat conducting material, and including a first end portion and a second end portion on a side opposite to the first end portion and generating heat upon energization between the first end portion and the second end portion,
    a central portion between the first end portion and the second end portion of the heating element is arranged inside the barrel, and
    the first end portion and the second end portion of the heating element are arranged outside the barrel.

2. The apparatus according to claim 1, wherein the heating element is a member having a variation in at least one of a density, a resistivity, and a heat conductivity as physical properties between the first end portion and the second end portion falling within a predetermined range.

3. The apparatus according to claim 1, wherein the heating element has a variation in physical properties between the first end portion and the second end portion falling within a range of 3%.

4. The apparatus according to claim 1, wherein the heating element is made of the same material between the first end portion and the second end portion.

5. The apparatus according to claim 1, wherein letting Hmax be a maximum thickness and Hmin be a minimum thickness, the heating element is configured to satisfy Hmax/Hmin≤2 between the first end portion and the second end portion.

6. The apparatus according to claim 1, wherein the heating element has a tensile strength between the first end portion and the second end portion being not less than 100 MPa.

7. The apparatus according to claim 1, wherein the heating element has a melting point of not less than 200° C.

8. The apparatus according to claim 1, wherein the heating element is sandwiched between a first member and a second member supported by the barrel.

9. The apparatus according to claim 8, wherein
    the first member is arranged on an optical element side with respect to the second member, and
    a heat conductivity of the first member is higher than that of the second member.

10. The apparatus according to claim 1, wherein
    the adjustment unit further includes a control unit configured to control energization to the heating element and a connector configured to electrically connect the first end portion and the second end portion to the control unit, and
    the connector is arranged outside the barrel.

11. The apparatus according to claim 1, wherein the central portion is arranged to have a shape along an edge portion of the optical element so as to apply heat to the edge portion.

12. The apparatus according to claim 11, wherein the central portion is arranged to have an arcuated shape along the edge portion of the optical element.

13. The apparatus according to claim 1, wherein between the first end portion and the second end portion, the heating element does not include a joint portion to be formed when two members are joined.

14. The apparatus according to claim 1, wherein between the first end portion and the second end portion, the heating element does not include a solder joint and an adhesive joint.

15. The apparatus according to claim 1, wherein a plurality of the heating element are provided for the one optical element.

16. The apparatus according to claim 1, wherein the central portion of the hating element is arranged inside the barrel so as to be spaced apart from the optical element.

17. The apparatus according to claim 1, wherein the heating element is a member having a variation in physical properties between the first end portion and the second end portion falling within a predetermined range.

18. The apparatus according to claim 1, wherein the heating element is a single conductor that constitutes a power supply path between the first end portion and the second end portion not to include a joint portion to be formed when two members are joined, and generates heat by supplying power between the first end portion and the second end portion.

19. A method of manufacturing an article, the method comprising:
    exposing a substrate using an exposure apparatus;
    developing the exposed substrate; and
    processing the developed substrate to manufacture the article,
    wherein the exposure apparatus exposes the substrate and includes:
        an optical system including a barrel and an optical element arranged in the barrel; and an adjustment unit including a heating element configured to generate heat, the adjustment unit being configured to adjust imaging characteristics of the optical system by conducting heat generated in the heating element to the optical element, wherein the heating element is a single member, formed of a heat conducting material, and including a first end portion and a second end portion on a side opposite to the first end portion and generating heat upon energization between the first end portion and the second end portion, a central portion between the first end portion and the second end portion of the heating element is arranged inside the barrel, and the first end portion and the second end portion of the heating element are arranged outside the barrel.

20. An exposure apparatus for exposing a substrate, comprising:

an optical system including a barrel and an optical element arranged in the barrel; and an adjustment unit including a heat radiator configured to radiate heat, the adjustment unit being configured to adjust imaging characteristics of the optical system by applying heat to the optical element from the heat radiator, wherein the heat radiator is a member including a first end portion and a second end portion on a side opposite to the first end portion and having a variation in physical properties between the first end portion and the second end portion falling within a predetermined range, a central portion between the first end portion and the second end portion of the heat radiator is arranged inside the barrel so as to be spaced apart from the optical element, and the first end portion and the second end portion of the heat radiator are arranged outside the barrel, wherein letting Hmax be a maximum thickness and Hmin be a minimum thickness, the heat radiator is configured to satisfy Hmax/Hmin 2 between the first end portion and the second end portion.

21. An exposure apparatus for exposing a substrate, comprising:

an optical system including a barrel and an optical element arranged in the barrel; and an adjustment unit including a heat radiator configured to radiate heat, the adjustment unit being configured to adjust imaging characteristics of the optical system by applying heat to the optical element from the heat radiator, wherein the heat radiator is a member including a first end portion and a second end portion on a side opposite to the first end portion and having a variation in physical properties between the first end portion and the second end portion falling within a predetermined range, a central portion between the first end portion and the second end portion of the heat radiator is arranged inside the barrel so as to be spaced apart from the optical element, and the first end portion and the second end portion of the heat radiator are arranged outside the barrel, wherein the heat radiator has a tensile strength between the first end portion and the second end portion being not less than 100 MPa.

22. An exposure apparatus for exposing a substrate, comprising:

an optical system including a barrel and an optical element arranged in the barrel; and an adjustment unit including a heat radiator configured to radiate heat, the adjustment unit being configured to adjust imaging characteristics of the optical system by applying heat to the optical element from the heat radiator, wherein the heat radiator is a member including a first end portion and a second end portion on a side opposite to the first end portion and having a variation in physical properties between the first end portion and the second end portion falling within a predetermined range, a central portion between the first end portion and the second end portion of the heat radiator is arranged inside the barrel so as to be spaced apart from the optical element, and the first end portion and the second end portion of the heat radiator are arranged outside the barrel, wherein the heat radiator has a melting point of not less than 200° C.

* * * * *